(12) United States Patent
Waggel et al.

(10) Patent No.: US 11,558,984 B2
(45) Date of Patent: Jan. 17, 2023

(54) SYSTEM AND METHOD FOR CONDENSATION FREE MEDIUM VOLTAGE VARIABLE FREQUENCY DRIVE

(71) Applicant: Siemens Aktiengesellschaft, Munich (DE)

(72) Inventors: Jason Waggel, Connellsville, PA (US); Matthew Marullo, Pittsburgh, PA (US); Jiahui Zhang, Delmont, PA (US); Marc F. Aiello, Oakmont, PA (US)

(73) Assignee: Siemens Aktiengesellschaft, Munich (DE)

(*) Notice: Subject to any disclaimer, the term of this patent is extended or adjusted under 35 U.S.C. 154(b) by 225 days.

(21) Appl. No.: 16/754,021

(22) PCT Filed: Oct. 9, 2017

(86) PCT No.: PCT/US2017/055716
§ 371 (c)(1),
(2) Date: Apr. 6, 2020

(87) PCT Pub. No.: WO2019/074471
PCT Pub. Date: Apr. 18, 2019

(65) Prior Publication Data
US 2020/0244210 A1 Jul. 30, 2020

(51) Int. Cl.
*H05K 7/20* (2006.01)
*H02M 7/00* (2006.01)
(Continued)

(52) U.S. Cl.
CPC ........ *H05K 7/20909* (2013.01); *H02M 7/003* (2013.01); *H05K 7/20945* (2013.01); *G05D 22/02* (2013.01); *H02P 29/60* (2016.02)

(58) Field of Classification Search
CPC .......... H05K 7/20909; H05K 7/20945; H04M 7/003; H02P 29/60; G05D 22/02
See application file for complete search history.

(56) References Cited

U.S. PATENT DOCUMENTS

| 5,934,368 A | 8/1999 | Tanaka et al. |
| 7,312,593 B1 | 12/2007 | Streicher et al. |
| (Continued) | | |

FOREIGN PATENT DOCUMENTS

| EP | 1993195 A2 | 11/2008 |
| JP | 2013158181 A | 8/2013 |
| (Continued) | | |

OTHER PUBLICATIONS

PCT International Search Report and Written Opinion of International Searching Authority dated Jul. 4, 2018 corresponding to PCT International Application No. PCT/US2017/055716 filed Oct. 9, 2017.

*Primary Examiner* — Mukundbhai G Patel

(57) ABSTRACT

A temperature control system (300) for a variable frequency drive (10, 100) includes a sealed enclosure (310), a power electronic component (330) and/or a power magnetic component (320) positioned inside the sealed enclosure (310), and a controller (400) configured to control a temperature of the power electronic component (330) and/or the power magnetic component (320) relative to an internal air temperature (Tair) inside the sealed enclosure (310) prior to an electrical energy application and operation of the power electronic component (320) and/or power magnetic component (320) to prevent condensation induced electrical failure of the power electronic component (330) and/or power magnetic component (320) utilizing a cooling system (340) and/or a heating system (350).

19 Claims, 4 Drawing Sheets

(51) Int. Cl.
  *H02P 29/60* (2016.01)
  *G05D 22/02* (2006.01)

(56) References Cited

U.S. PATENT DOCUMENTS

2018/0249595 A1* 8/2018 Ashbaugh ............ H05K 5/0213
2019/0239367 A1* 8/2019 Elliott .................. H05K 7/1432

FOREIGN PATENT DOCUMENTS

RU    2606256 C2   1/2017
SU    1115028 A1   9/1984
SU    1644105 A1   4/1991

* cited by examiner

SYSTEM AND METHOD FOR CONDENSATION FREE MEDIUM VOLTAGE VARIABLE FREQUENCY DRIVE

BACKGROUND

1. Field

Aspects of the present invention generally relate to a temperature control system and method for a condensation free medium voltage variable frequency drive. Throughout the specification, the terms "drive", "drive system" and "power supply" can be used interchangeably.

2. Description of the Related Art

Medium voltage (MV) variable frequency drives, such as for example multilevel power converters, are used in applications of medium voltage alternating current (AC) drives, flexible AC transmission systems (FACTS), and High Voltage DC (HVDC) transmission systems, because single power semiconductor devices cannot handle high voltage. Multilevel power converters typically include a plurality of power cells for each phase, each power cell including an inverter circuit having semiconductor switches that are capable of altering the voltage output of the individual cells.

One example of a multilevel power converter is a cascaded H-bridge converter system having a plurality of H-bridge cells as described for example in U.S. Pat. No. 5,625,545 to Hammond, the content of which is herein incorporated by reference in its entirety. Another example of a multilevel power converter is a modular multilevel converter system having a plurality of M2C or M2LC subsystems.

Many applications of variable frequency drives require components or system of components to be packaged for outside operation which in turn requires a sealed and insulated container or cabinet system. The level of humidity or cabinet dew point internal to the container or cabinet system then becomes a primary concern since the outside air temperatures in many cases can be very low which would induce the potential for condensation induced electrical faults. Maintaining a low cabinet dew point temperature less than the outside air cooling available is not practical for equipment requiring long operation periods in remote areas. Thus, a need exists to provide an improved variable frequency drive for outside operation.

SUMMARY

Briefly described, aspects of the present invention relate to a temperature control system and method for a condensation free medium voltage variable frequency drive.

A first aspect of the present invention provides a temperature control system for a variable frequency drive comprising a sealed enclosure, a power magnetic component and/or a power electronic component positioned inside the sealed enclosure, and a controller configured to control a temperature of the power magnetic component and/or power electronic component relative to an internal air temperature inside the sealed enclosure prior to an electrical energy application and operation of the power magnetic component and/or power electronic component to prevent condensation induced electrical failure of the power magnetic component and/or power electronic component, wherein the internal air temperature is equal to or greater than a dew point temperature inside the sealed enclosure.

A second aspect of the present invention provides a variable frequency drive comprising a temperature control system.

A third aspect of the present invention provides a method of controlling a temperature within a sealed enclosure comprising one or more components of a variable frequency drive comprising regulating an internal air temperature inside the sealed enclosure such that the internal air temperature is equal or greater than a dew point temperature; determining temperatures of the one or more components positioned inside the sealed enclosure; controlling the temperatures of the one or more components relative to the internal air temperature prior to an electrical energy application and operation of the one or more components to prevent condensation induced electrical failure of the one or more components; and applying electrical input energy to the one or more components.

DETAILED DESCRIPTION

To facilitate an understanding of embodiments, principles, and features of the present invention, they are explained hereinafter with reference to implementation in illustrative embodiments. In particular, they are described in the context of being a temperature control system for a variable frequency drive, in particular medium voltage (MV) variable frequency drives including multi-cell power supplies such as modular multilevel converter systems and cascaded H-bridge converter systems. Embodiments of the present invention, however, are not limited to use in the described devices or methods.

As used herein, a "medium voltage" is a voltage of greater than about 690V and less than about 69 KV, and a "low voltage" is a voltage less than about 690V. Persons of ordinary skill in the art will understand that other voltage levels may be specified as "medium voltage" and "low voltage". For example, in some embodiments, a "medium voltage" may be a voltage between about 3 kV and about 69 kV, and a "low voltage" may be a voltage less than about 3 kV.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
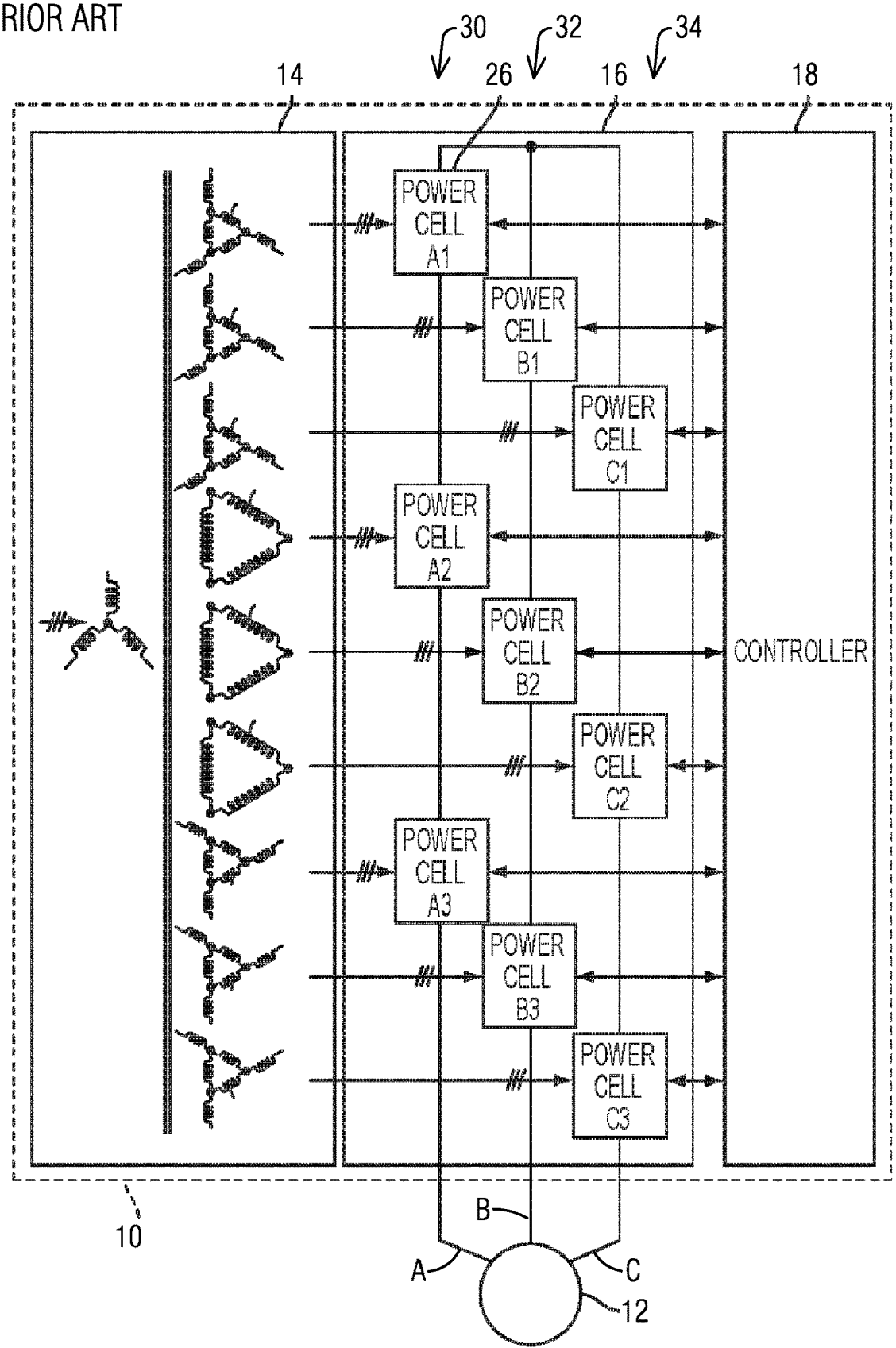
FIG. 1 illustrates a schematic of a known basic configuration of a cascaded H-bridge converter system in accordance with an exemplary embodiment disclosed herein.
Figure 2:
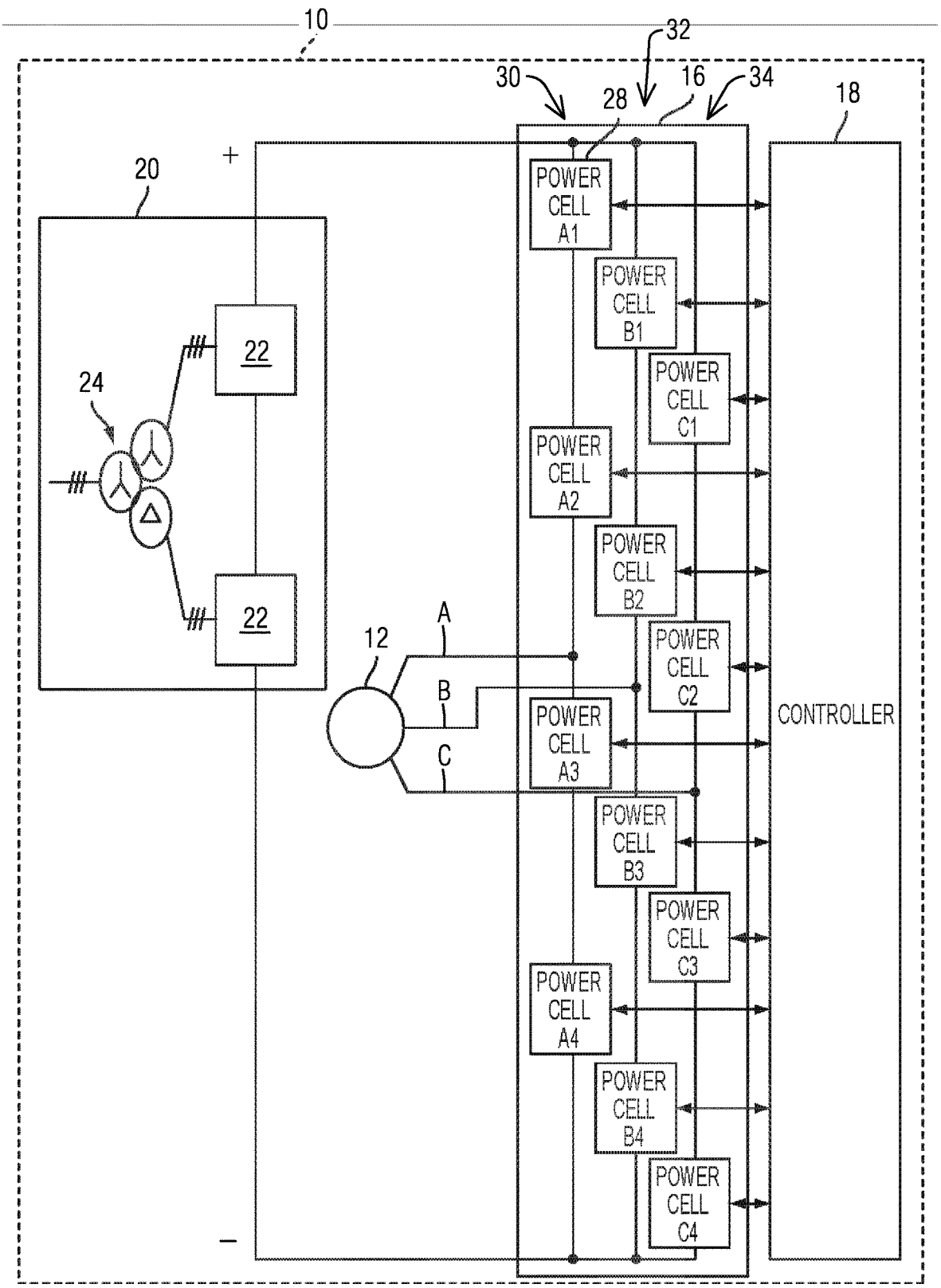
FIG. 2 illustrates a schematic of another known basic configuration of a cascaded H-bridge converter system in accordance with an exemplary embodiment disclosed herein.

FIG. 1 and FIG. 2 each illustrate a schematic of a known multi-cell power supply 10, specifically a cascaded H-bridge converter system that receives three-phase power from an AC source, and delivers power to a load 12, e.g., a three-phase AC motor.

As shown in FIG. 1, a multi-cell power supply 10 includes a transformer 14, a power circuit 16, and a controller 18. The transformer 14 includes a primary winding that excites nine secondary windings, and power circuit 16 includes multiple PCB power cells 26, herein simply referred to as power cells 26, that are operably coupled to the secondary windings, respectively, of the transformer 14. As the power supply 10 comprises nine secondary windings, and a power cell 26 is operably coupled to each secondary winding, the power supply 10 comprises nine power cells 26. Of course, the power supply 10 can comprise more or less than nine power cells 26 and/or more or less than nine secondary windings depending on a type of the power supply 10 and/or a type of the load 12 coupled to the power supply 10.

The power cells 26 can be rated for lower voltages and are configured to provide a medium voltage output to the load 12. In particular, each output phase A, B, C of the power circuit 16 is fed by a group of series-connected power cells 26. Outputs of the power cells 26 are coupled in series in a first phase group 30, at second phase group 32, and a third phase group 34. Each phase output voltage is a sum of the output voltages of the power cells 26 in the respective phase group 30, 32 and 34. For example, the first phase group 30 comprises power cells 26 labelled A1, A2 and A3, wherein the phase output voltage of the output phase A is the sum of the output voltages of the power cells A1, A2 and A3. The same applies to output phase B and power cells B1, B2, B3, and output phase C and power cells C1, C2, C3. In this regard, the power circuit 16 delivers a medium voltage output to load 12 using lower voltage rated power cells 26 that include components rated to lower voltage standards. Each power cell 26 is coupled, e.g., for example via an optical fiber communication link, to controller 18, which may use current feedback and voltage feedback to control operation of the power cells 26.

As illustrated in FIG. 2, a multi-cell power supply 10 includes three-phase AC power supply 20, a power circuit 16, and a controller 18. The three-phase AC power supply 20 includes two diode bridges which are each connected on the AC voltage side to secondary windings of a power converter transformer 24, and are electrically connected in series on the DC voltage side. A positive and a negative DC voltage bus are provided for the parallel connection of these phase groups. The power circuit 16 includes power cells 28 that are coupled to the DC voltage bus created by the power supply 20. The power cells 28 are for example lower voltage rated and are configured to provide medium voltage output to load 12. Although the load 12 may be illustrated as being within the multi-cell power supply 10, the load 12 is not part of the multi-cell power supply 10. Rather, the load 12 is separate from, and connected to, the multi-cell power supply 10, as more clearly shown in FIG. 1.

Each output phase A, B, C of the power circuit 16 is fed by a group of series-connected power cells 28, also labelled A1-A4, B1-B4 and C1-C4 with reference to the output phases A, B, C. The power cells 28 are coupled in series in a first phase group 30, a second phase group 32, and a third phase group 34. Each phase output voltage is a sum of the output voltages of the power cells 28 in the phase group 30, 32 and 34 as described before with reference to FIG. 1. The power circuit 16 delivers a medium voltage output to the load 12 using lower voltage rated power cells 28 that include components rated to lower voltage standards. Each power cell 28 is coupled, e.g., for example via optical fiber communication link(s), to the controller 18, which can use current feedback and voltage feedback to control operation of the power cells 28.

It should be noted that in FIG. 1 and FIG. 2 the number of power cells 26, 28 in each phase group 30, 32, 34 can be between 2 and 12 to provide different medium voltage outputs as required by the load 12. As noted before, in the embodiment of FIG. 1, the number of secondary windings of transformer 14 matches the number of power cells 26. In the embodiment of FIG. 2, a number of diode bridges and transformer secondary windings can vary from 1 to 6 to allow for harmonic cancellation on the primary side of the transformer 24. It will be appreciated by those of ordinary skill in the art that other cell counts and diode bridge counts may be used depending upon the application and that the configurations shown and described herein are intended to be exemplary in natures.

Figure 3:
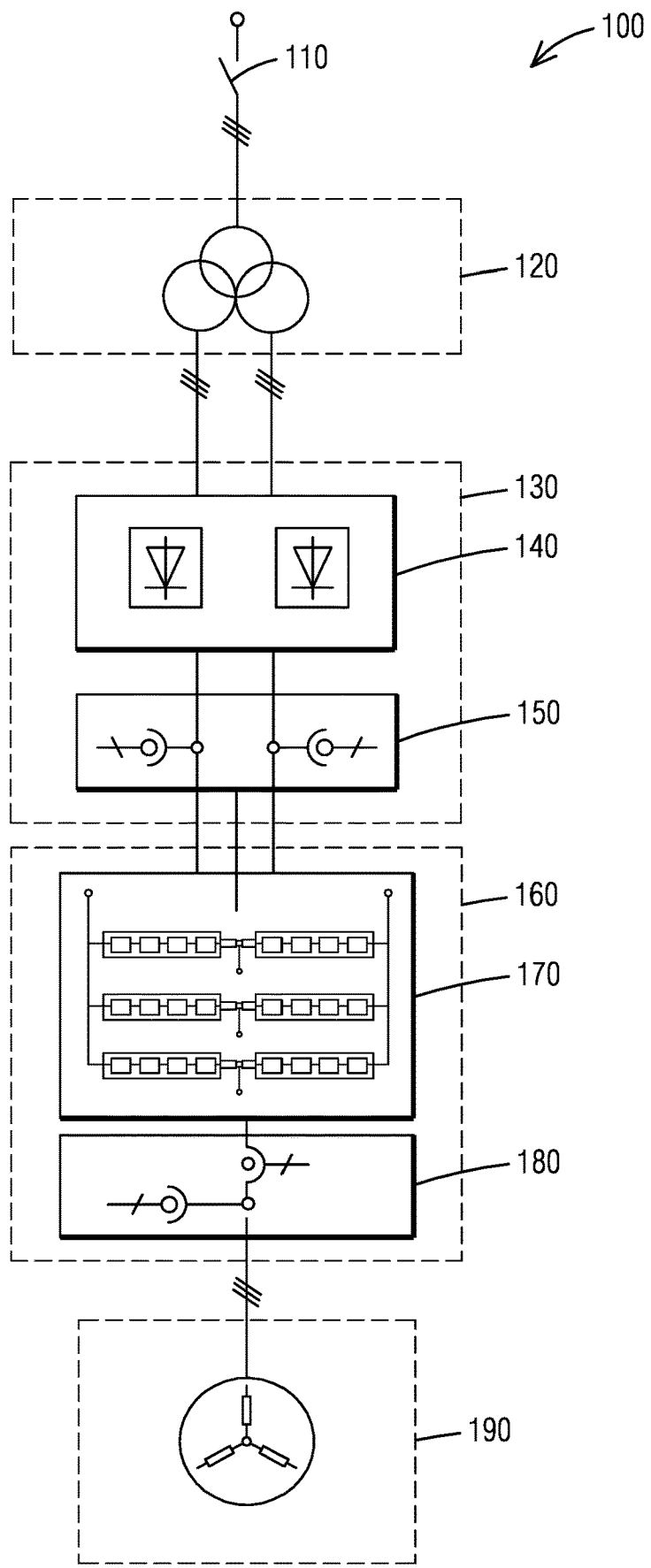
FIG. 3 illustrates a schematic of a basic configuration of a modular multilevel converter system in accordance with an exemplary embodiment disclosed herein.

FIG. 3 illustrates a schematic of a known basic configuration of a modular multilevel converter system 100 in accordance with an exemplary embodiment described herein. In an example, the converter system 100 comprises a basic input module 130 and an output module 160 deploying M2C or M2LC technology. The basic input module 130 generates a DC voltage and provides energy for the output module 160 connected to the basic input module 130. In an example, the basic input module 130 can comprise series-connected six-pulse rectifiers 140. The output module 160 provides power for a connected motor 190, which can be for example a high voltage AC motor. The output module 160 is supplied with power for the motor 190 via the basic input module 130, which represents a DC link. The output module 160 comprises an inverter unit 170 with M2C or M2LC technology comprising multiple semiconductors, in particular Insulated Gate Bipolar Transistors (IGBTs). The output module 160 including M2C or M2LC subsystems, herein also referred to as power cells, provides the motor 190 with almost sinusoidal voltages. In an example, the inverter 170 can comprises three phases. Each phase comprises two so-called M2C or M2LC branches. The six branches of the inverter 170 each consist of identical subsystems (power cells) connected in series.

FIG. 3 further illustrates a circuit-breaker 110 and transformer 120 as an example for a power supply for the converter system 100. Furthermore, the converter system 100 can comprise one or more measuring units 150, 180 used to measure voltages and currents. For example, measuring unit 150 measures voltages and currents of the basic line module 130, and measuring unit 180 measures voltages and currents on the motor side. Voltages can be measured using AVT (actual value transmission) combination modules, currents can be measured using electronic current transformers and AVT combination modules. The AVT combination modules convert analog signals into digital signals and transfer the signals to a control unit for example via fiber-optic cables. It should be noted that the converter system 100 of FIG. 1 may comprise more components, such as for example control module(s), cooling module(s), braking module(s) and/or bypass module(s). Control module(s) are typically used for open-loop and closed-loop control of the drive as well as operating control and diagnostics of the drive.

Figure 4:
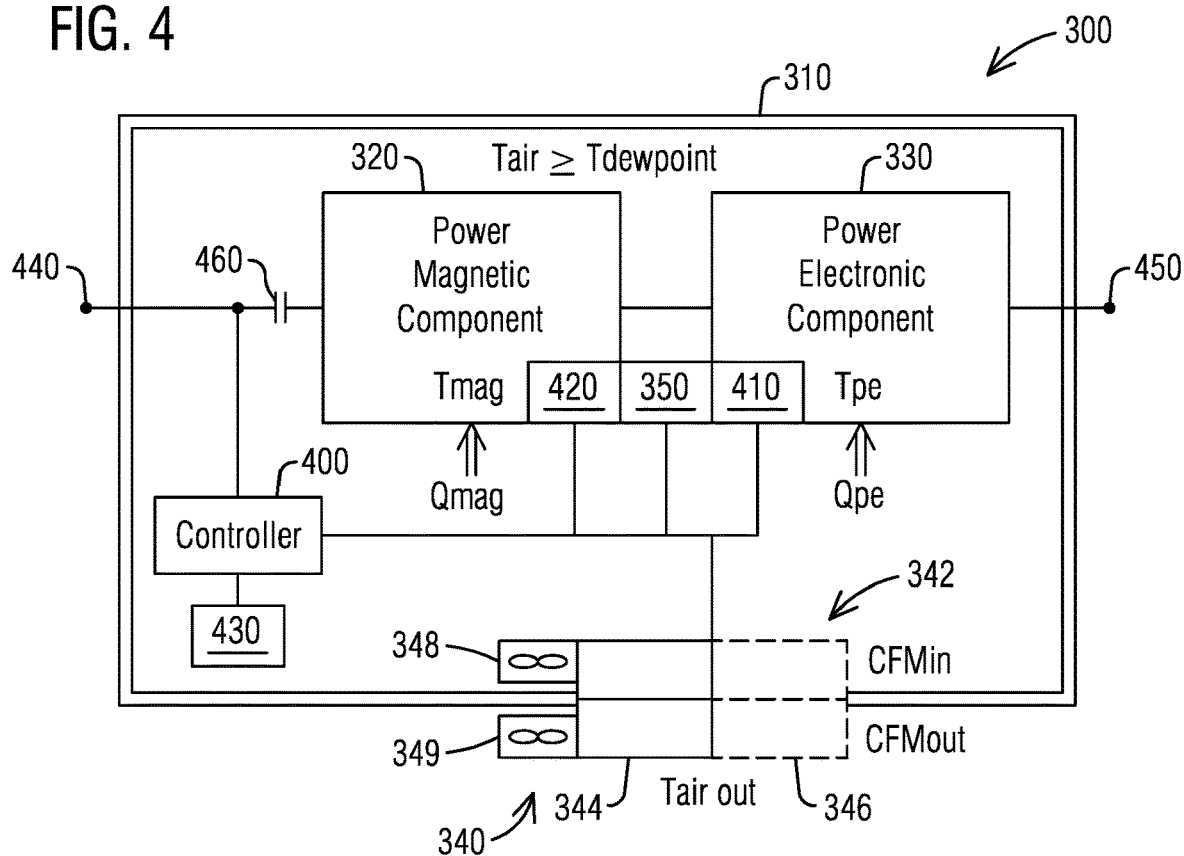
FIG. 4 illustrates a schematic of a temperature control system for a variable frequency drive in accordance with an exemplary embodiment disclosed herein.

FIG. 4 illustrates a schematic of a temperature control system 300 for a variable frequency drive in accordance with an exemplary embodiment disclosed herein. The variable frequency drive can be for example a power supply as described with reference to FIG. 1, FIG. 2 or FIG. 3.

As noted before, many applications of variable frequency drives require components or system of components to be packaged for outside operation which in turn requires a sealed and insulated container or cabinet system. The level of humidity or cabinet dew point internal to the container or cabinet system then becomes the primary concern since the outside air temperatures in many cases can be very low which would induce the potential for condensation induced electrical faults.

Described are a system and method to verify and control an operating temperature of electrically energized components of the power supply above a cabinet dew point temperature before electrical energy is applied to these components. Since an internal air temperature of the cabinet is regulated to be equal or greater than its dew point temperature, a system comprising for example temperature sensor(s), heating system(s) and air flow control can be used to attain desired operating condition(s) before electrical power is applied and maintain condensation free operation thereafter.

The temperature control system 300 for a variable frequency drive comprises a sealed and insulated enclosure 310 which houses multiple components of the variable frequency drive. Since the variable frequency drive is specifically provided for outside operation, the sealed and insulated enclosure 310 is necessary. For example, outside temperatures may be as low as −45° C. Thus, the sealed and insulated enclosure 310 is designed as a fully sealed and insulated enclosure having NEMA rating 4. The National Electrical Manufacturer Association (NEMA) uses a standard rating system that defines the types of environments in which an electrical enclosure can be used, and frequently signifies a fixed enclosure's ability to withstand certain environmental conditions. A standard of NEMA defines a product in reference to its attributes and capabilities. An enclosure having NEMA rating 4 is constructed for either indoor or outdoor use to provide a degree of protection to personnel against access to hazardous parts; to provide a degree of protection of the equipment inside the enclosure against ingress of solid foreign objects (falling dirt and windblown dust); to provide a degree of protection with respect to harmful effects on the equipment due to the ingress of water (rain, sleet, snow, splashing water, and hose directed water); and that will be undamaged by the external formation of ice on the enclosure.

At least one power electronic component 330 is positioned inside the sealed and insulated enclosure 310. The at least one power electronic component 330 can comprise multiple power cells configured as M2C subsystems or M2CL subsystems, or cascaded H-Bridge subsystems (see FIGS. 1-3). In another example, the at least one power electronic component 330 can comprise a multi-pulse rectifier.

The temperature control system 300 comprises a controller 400 configured to control a temperature of the at least one power electronic component 330 relative to an internal air temperature Tair inside the sealed enclosure 310 prior to an electrical energy application and operation of the at least one power electronic component 330 such that condensation induced electrical failure of the at least one power electronic component 330 is prevented. The temperature of the at least one power electronic component 330 and/or the internal air temperature Tair is controlled via a cooling system 340 and/or a heating system 350.

The cooling system 340 comprises a heat exchanger 342. The heat exchanger 342 is coupled to the enclosure 310 and positioned such that components, for example the at least one power electronic component 330, inside the enclosure 310 can be cooled and heat extracted to the outside of the enclosure 310.

In an embodiment, the heat exchanger 342 is an air-to-air heat exchanger, i.e. both cooling fluid and fluid to be cooled are air. For example, the heat exchanger 342 can be configured as cross-flow heat exchanger. In another example, the heat exchanger 342 can be configured as counter-flow heat exchanger. It is noted that the concepts of cross-flow and counter-flow heat exchangers will not be described in detail herein because one of ordinary skill in the art is familiar with these concepts.

In another embodiment, the heat exchanger 342 is configured as modular heat exchanger such that a cooling capacity of the heat exchanger 342 is adaptable by subtraction or addition of modules. FIG. 4 illustrates a heat exchanger 342 comprising two modules 344, 346. Of course, the heat exchanger 342 can comprise only one module 344 or more than the two modules 344, 346.

The cooling system 340 further comprises one or more fan(s) 348, 349. Fan 348 is positioned inside the enclosure 310, whereas fan 349 is positioned outside the enclosure 310. Fan 348 is utilized to circulate air within the enclosure 310. Fan 349 is utilized for removing heat from the enclosure 310.

In order to determine when the at least one power electronic component 330 needs to be cooled, the at least one power electronic component 330 comprises a temperature sensor 410 for measuring a temperature of the at least one power electronic component 330, which in turn is coupled to the controller 400. Based on a measured temperature provided by the sensor 410, the controller 400 may send a signal to the cooling system 340 to start operation and for example cool an inside air of the enclosure 310.

The enclosure 310 may further comprise and house at least one power magnetic component 320, which can be for example an isolation transformer, an input inductor, an output inductor or a combination thereof. In an example, the at least one power electronic component 330 and power magnetic component 320 form the variable frequency drive. There may be instances where the enclosure 310 may only house the at least one power electronic component 330, and the power magnetic component 320 may be located remotely.

The controller 400 is further configured to control a temperature of the at least one power magnetic component 320 relative to the internal air temperature Tair inside the sealed enclosure 310 prior to an energy application and operation of the at least one power magnetic component 320 to prevent condensation induced electrical failure of the at least one power magnetic component 320.

The temperature control system 300 can further comprise heating system 350. In an embodiment, the heating system 350 comprises heating elements placed at predetermined locations directly on the at least one power magnetic component 320 and/or power electronic component 330, for example at directly on a magnetic core of an isolation transformer. In another embodiment, the heating system 350 comprises induction heating via elevated excitation frequency at reduced voltage to control a temperature of the at least one power magnetic component 320 and/or power electronic component 330. Further, the at least one power magnetic component 320 comprises a temperature sensor 420, for example applied directly to the magnetic core to measure a temperature of the at least one power magnetic component 320.

The system 300 further comprises electrical input 440 and electrical output 450. Electrical input 440 may be configured as three-wire input and electrical output 450 as three-wire output to reduce a number of interconnecting wires. The three-wire configuration simplifies complexity and reduces cost of supplying multiple power feeds to the variable frequency drive system. The three-wire input configuration can also provide fuse protection for the power magnetic component 320 and branch protection for control power of the drive system.

In summary, provided are system 300 and method 500 for bringing the fully sealed NEMA 4 rated enclosure 310 comprising a medium voltage variable frequency motor drive system, including power electronic component 330 and power magnetic component 320, from an extremely low outside ambient temperature of up to approximately −45° C., up to an acceptable internal temperature Tair to allow for an energization of medium voltage on the power magnetic component 320, and subsequently, regulate and maintain the internal temperature Tair within an acceptable range for the power electronic component 330 and power magnetic component 320 contained within the enclosure 310 while running at full output power.

The cooling system 340 comprising integral heat exchanger 342 is utilized to isolate the internal components 320, 330 of the enclosure 310 from the outside air Tairout while still providing required cooling to the components 320, 330 under fully loaded operating conditions. The system 300 further provides heating system 350 for heating the power magnetic component 320 and/or the power electronic component 330 to an acceptable energization temperature using heating elements, for example placed at predetermined locations on the power magnetic component 320, for example a transformer core, with temperature sensors 410, 420 to regulate a surface temperature of the components 320, 330. The internal temperature Tair of the enclosure 310 can further be regulated by radiated heat from the power magnetic component 320 and by heaters placed in a forced air path to maximize an efficiency of the heating elements and bring the internal air temperature Tair up to a level where condensation is not formed inside the enclosure 310 or if condensation is formed, to dry it out. This means that the internal component temperatures of components 320 and 330 must be equal or greater than a dew point temperature (Tdewpoint) of the internal air (Tair≥Tdewpoint) before being energized to voltages which might induce electrical leakage currents leading ultimately leading to component damage.

Since a specific heat or heat capacity of materials like silicon steel used in power magnetic components 320 or aluminum and copper used in power electronic components 330, such as heatsinks and electrical bus, is much greater than that of air surrounding them, in particular when the components 320, 330 are in operation, temperature sensing (temperature sensors 410, 420) is used to verify that the components 320, 330 are at least at equal and or higher temperature than the internal air temperature which is always at least equal to or greater than the dew point temperature Tdewpoint, i.e. Tair≥Tdewpoint. An external heat source such as the heating system 350 is provided to increase temperature of the components 320, 330 so that the components 320, 330 attain this condition Tair Tdewpoint prior to electrical energy application. Further, since a level of airflow moving through the heat exchanger 342 on both inside and outside of the cabinet or enclosure 310 (CFMin, CFMout) dictates a level of heat which can be transferred to the outside of the enclosure 310, the level of airflow is controlled as required to maintain condensation free operation as well to control a maximum operating temperature of the equipment 320, 330 inside the enclosure 310.

Figure 5:
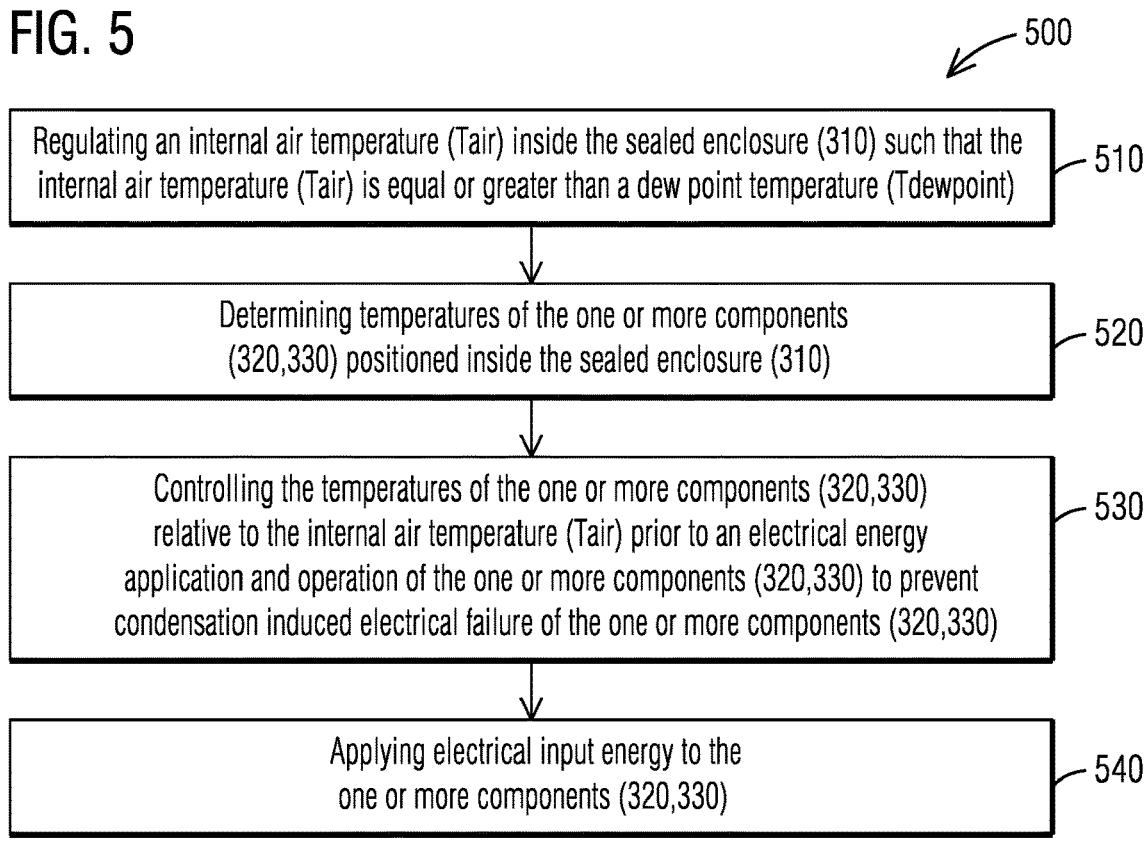
FIG. 5 illustrates a flowchart of a method for controlling a temperature inside an enclosure comprising a variable frequency drive in accordance with an exemplary embodiment disclosed herein.

FIG. 5 illustrates a flowchart of a method 500 for controlling a temperature inside an enclosure 310 comprising a variable frequency drive in accordance with an exemplary embodiment disclosed herein. The method 500 is performed using for example the temperature control system 300 as described herein.

Step 510 comprises determining the internal air temperature Tair inside the enclosure 310 utilizing a temperature sensor, such as for example temperature sensor 430. If the internal air temperature Tair is below its dew point temperature Tdewpoint, the internal air temperature Tair is increased to be equal or greater than the dew point temperature Tdewpoint, for example by heaters, in order to prevent condensation, the internal air temperature Tair must be greater than or equal to the dew point temperature or wet bulb temperature Tdewpoint of the air inside the enclosure 310.

Step 520 comprises determining, for example measuring, temperatures of components 320, 330 within the enclosure 310. Specifically, a surface temperature Tpe of the power electronic component 330 and/or a surface temperature Tmag of the power magnetic component 320 are measured utilizing temperature sensors, such as for example temperature sensors 410, 420.

Step 530 comprises controlling the temperatures of the one or more components 320, 330 relative to the internal air temperature Tair prior to an electrical energy application and operation of the one or more components 320, 330 to prevent condensation induced electrical failure of the one or more components 320, 330. The temperatures are controlled utilizing for example the cooling system 340 and/or heating system 350. Then, electrical input energy is applied to the one or more components 320, 330 and the power supply starts operation (step 540).

To prevent condensation within the enclosure 310, and in particular in view of the components 320, 330, heat, labelled as Qmag and Qpe, is applied to those components 320, 330 which are known to be of a temperature less than the internal air temperature Tair (which in turn is equal or greater than the dew point temperature Tdewpoint) using the heating system 350. Heat Qmag, Qpe is added to the component 320 and/or component 330 until the temperatures Tmag, Tpe of the components 320, 330 are greater than the internal air temperature Tair before electrical input energy is allowed, for example by closing contact 460 energizing the power magnetic component 320 and/or power electronic component 330.

The internal air temperature Tair of the enclosure 310 can further be regulated by radiated heat from the power magnetic components 320, once in operation, and by the heaters placed in a forced air path to maximize efficiency of the heating elements of the heating system 350.

During operation of the power supply, components 320, 330 typically increase in temperature and require cooling. Thus, the components 320, 330 are cooled using the cooling system 340. The controller 400 is configured to receive temperatures measurements from the temperature sensors 410, 420, 430 of the components 320, 330 and the enclosure 310 and provides signal(s) to the cooling system 340 to start cooling operation. While cooling, the internal air temperature Tair is also regulated to be equal or greater than the dew point temperature Tdewpoint to avoid condensation within the enclosure 310.

In a further embodiment, the controller 400 is configured to not allow air to flow on either side of the heat exchangers (CFMin, CFMout) until the condition Tair Tdewpoint is met. A flow rate of an internal air circuit CFMin is increased from zero only after Tpe and Tmag>Tair, using for example fan 348. At this point Qmag and Qpe can be removed. As temperature increases from normal electrical operation and allows heat transfer to the outside air (Tair out), a flow rate of the external air circuit CFMout can then be increased as required to maintain the cabinet air temperature, using for example fan 349. In this way, condensation is eliminated prior to electrical energy application and the internal air temperature Tair is always maintained greater than or equal to the component temperatures guaranteeing that these components stay condensation free.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

The invention claimed is:

1. A temperature control system for a variable frequency drive comprising:
   a sealed enclosure,
   a power magnetic component and a power electronic component positioned inside the sealed enclosure,
   a cooling system comprising a heat exchanger, the heat exchanger being positioned such that, when in operation, the power magnetic component and power electronic component are cooled and heat is extracted to an outside of the sealed enclosure, and
   a controller configured to:
      control a temperature of the power magnetic component and the power electronic component relative to an internal air temperature inside the sealed enclosure prior to an electrical energy application and operation of the power magnetic component and the power electronic component to prevent condensation induced electrical failure of the power magnetic component and power electronic component,
      wherein the internal air temperature is equal to or greater than a dew point temperature inside the sealed enclosure, and
   wherein the cooling system further comprises a first fan and a second fan, the first fan positioned inside the sealed enclosure to circulate air within the enclosure, and the second fan positioned outside the sealed enclosure to remove heat from the enclosure.

2. The temperature control system of claim 1, wherein the heat exchanger is configured as closed loop air-to-air heat exchanger.

3. The temperature control system of claim 2, wherein the air-to-air heat exchanger is configured as cross-flow heat exchanger or counter-flow heat exchanger.

4. The temperature control system of claim 1, wherein the heat exchanger is configured as modular heat exchanger comprising one or more modules such that a cooling capacity is adaptable by subtraction or addition of modules.

5. The temperature control system of claim 1, wherein the power electronic component comprises a temperature sensor for determining a surface temperature of the power electronic component.

6. The temperature control system of claim 1, wherein the power magnetic component comprises a temperature sensor for determining a surface temperature of the power magnetic component.

7. The temperature control system of claim 6, wherein the temperature sensor is applied directly to a magnetic core of the power magnetic component.

8. The temperature control system of claim 1, wherein the power electronic component comprises multiple power cells configured as M2C subsystems or M2CL subsystems, or cascaded H-Bridge subsystems.

9. The temperature control system of claim 1, wherein the power electronic component comprises a multi-pulse rectifier.

10. The temperature control system of claim 9, further comprising a heating system, wherein the controller is further configured to control a temperature of the power magnetic component relative to an internal air temperature inside the sealed enclosure prior to an electrical energy application and operation of the power electronic component to prevent condensation induced electrical failure of the power electronic component.

11. The temperature control system of claim 10, wherein the heating system comprises heating elements placed at predetermined locations directly on the power electronic component and/or power magnetic component.

12. The temperature control system of claim 10, wherein the heating system comprises induction heating via elevated excitation frequency at reduced voltage to control a temperature of the power electronic component and/or power magnetic component.

13. The temperature control system of claim 1, wherein the power magnetic component is selected from the group consisting of an isolation transformer, an input inductor, an output inductor, and a combination thereof.

14. The temperature control system of claim 1, further comprising an internal air temperature sensor positioned inside the sealed enclosure.

15. The temperature control system of claim 1, wherein the sealed and insulated enclosure is adapted as a fully sealed and insulated enclosure comprising NEMA 4 rating.

16. A variable frequency drive comprising a temperature control system as claimed in claim 1.

17. A method of controlling a temperature within a sealed enclosure comprising one or more components of a variable frequency drive comprising:
   regulating an internal air temperature inside the sealed enclosure such that the internal air temperature is equal or greater than a dew point temperature;
   determining temperatures of the one or more components positioned inside the sealed enclosure;
   controlling the temperatures of the one or more components relative to the internal air temperature prior to an electrical energy application and operation of the one or more components to prevent condensation induced electrical failure of the one or more components;
   applying electrical input energy to the one or more components;
   cooling the one or more components by a cooling system when the internal air temperature or the temperatures of the one or more components are greater than a predefined temperature by
   circulating air within the sealed enclosure by a fan positioned inside the enclosure; and
   removing heat from the sealed enclosure by a fan positioned outside the enclosure.

18. The method of claim 17, further comprising:
applying heat to the one or more components such that the temperatures of the one or more components are greater than the internal air temperature by a heating system.

19. The method of claim 17, further comprising:
controlling a flow rate of an internal air circuit within the sealed enclosure relative to the one or more components and the internal air temperature, and controlling a flow rate of an external air flow circuit outside the sealed enclosure relative to the internal air temperature, wherein the flow rates are controlled such that the flow rates are substantially zero until the internal air temperature is equal or greater than the dew point temperature.

* * * * *